(12) United States Patent
Rossner et al.

(10) Patent No.: US 7,554,258 B2
(45) Date of Patent: Jun. 30, 2009

(54) LIGHT SOURCE HAVING AN LED AND A LUMINESCENCE CONVERSION BODY AND METHOD FOR PRODUCING THE LUMINESCENCE CONVERSION BODY

(75) Inventors: Wolfgang Rossner, Holzkirchen (DE); Berit Wessler, Taufkirchen (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 140 days.

(21) Appl. No.: 10/684,083

(22) Filed: Oct. 10, 2003

(65) Prior Publication Data

US 2004/0145308 A1 Jul. 29, 2004

(30) Foreign Application Priority Data

Oct. 22, 2002 (DE) ................ 102 49 212

(51) Int. Cl.
*H01L 29/12* (2006.01)
*H01L 33/00* (2006.01)
*H01L 29/22* (2006.01)

(52) U.S. Cl. .............. 313/503; 313/498; 313/501

(58) Field of Classification Search ........... 313/498, 313/501, 502, 503
See application file for complete search history.

(56) References Cited

U.S. PATENT DOCUMENTS

| | | | | |
|---|---|---|---|---|
| 5,847,507 | A * | 12/1998 | Butterworth et al. | 313/512 |
| 6,504,301 | B1 * | 1/2003 | Lowery | 313/512 |
| 6,682,331 | B1 * | 1/2004 | Peh et al. | 425/112 |
| 6,703,780 | B2 * | 3/2004 | Shiang et al. | 313/504 |
| 6,791,259 | B1 * | 9/2004 | Stokes et al. | 313/503 |
| 2002/0084745 | A1 * | 7/2002 | Wang et al. | 313/498 |

FOREIGN PATENT DOCUMENTS

| | | |
|---|---|---|
| DE | 196 38 667 A1 | 9/1996 |
| DE | 199 38 053 A1 | 8/1999 |
| DE | 199 63 805 A1 | 12/1999 |
| GB | 2 325 080 A | 11/1998 |
| WO | WO 02/057198 A2 | 7/2002 |

* cited by examiner

*Primary Examiner*—Karabi Guharay
(74) *Attorney, Agent, or Firm*—Cohen Pontani Lieberman & Pavane LLP

(57) ABSTRACT

A light source, having at least one LED for emitting a primary radiation and at least one luminescence conversion body having at least one luminescent material for converting the primary radiation into a secondary radiation. The luminescence conversion body is a polycrystalline ceramic body which itself acts partly or completely as luminescent material by virtue of at least part of the base material which forms the ceramic body being activated by a dopant.

4 Claims, 2 Drawing Sheets

LIGHT SOURCE HAVING AN LED AND A LUMINESCENCE CONVERSION BODY AND METHOD FOR PRODUCING THE LUMINESCENCE CONVERSION BODY

TECHNICAL FIELD

The invention relates to a light source, having at least one LED for emitting a primary radiation and at least one luminescence conversion body having at least one luminescent material for converting the primary radiation into a secondary radiation. A method for producing the luminescence conversion body is furthermore specified.

PRIOR ART

A light source of the type mentioned is disclosed in DE 196 38 667 A1. The light source is referred to as a luminescence conversion LED. The LED (Light Emitting Diode) of the light source has, as active layer, for example a semiconductor layer made of gallium indium nitride (GaInN). Electrical driving causes a primary radiation from a first wavelength range to be emitted from this layer. The LED emits "blue" light, for example. The intensity maximum of the primary radiation is about 450 nm. The primary radiation is converted into a secondary radiation with the aid of a luminescent material. The luminescent material is for example a cerium-doped yttrium aluminum garnet (YAG:Ce, $Y_3Al_5O_{12}$:Ce). The luminescent material absorbs the primary radiation and emits secondary radiation from a second wavelength range. The luminescent material emits "yellow" light with an intensity maximum dependent on the cerium concentration.

The luminescent material is embedded in the form of powder particles in an epoxy resin or an inorganic glass having a low melting point. The epoxy resin and the glass serve as matrix of the powder particles. The powder particles together with the epoxy resin and the glass form the luminescence conversion body. The luminescence conversion body is for example a plate or a coating of the LED.

The epoxy resin and the glass are at least partly translucent to the primary radiation and the secondary radiation. This means that the primary radiation and the secondary radiation can pass through the epoxy resin and through the glass. In the case of the combination of luminescence conversion body with YAG:Ce and an LED with GaInN, yellow and blue radiation pass through the luminescence conversion body. The result is white radiation from the light source.

On account of the relatively high refractive index of the luminescent material in comparison with the surrounding matrix and on account of the grain size of the powder particles of the luminescent material, the powder particles in the respective matrix serve not only for luminescence conversion. The powder particles also function as scattering centers. This means that the primary radiation and secondary radiation are scattered at the powder particles of the luminescent material. Blue primary radiation and yellow secondary radiation leave the luminescence conversion body in nondirectional fashion. Primary radiation and secondary radiation are mixed homogeneously. This leads to a homogeneous color impression.

The LED of the known light source emits not only the blue radiation but also ultraviolet radiation with a relatively high intensity. This radiation may lead to a photoinduced chemical reaction of the epoxy resin. The epoxy resin is photochemically unstable. The photoinduced chemical reaction may give rise to reaction products which lead to a reduction of the transmissivity of the epoxy resin for the primary and secondary radiation. As a consequence of this, a light power of the light source decreases as the operating duration of the light source increases. The light power results from the extraction of photons from the semiconductor material of the LED, the efficiency of the luminescence conversion by the luminescence material and the efficiency of the coupling out of the primary and secondary radiation from the luminescence conversion body. The less transmissive the luminescence conversion body is for the primary and secondary radiation, the lower the light power.

DE 199 38 053 describes an LED surrounded by a silicone housing or ceramic part, it being possible for luminescent material powder to be embedded in the covering as impurity component.

DE 199 63 805 describes an LED whose chip is preceded both by a nonlinear crystal for frequency changing purposes and by a customary conversion element such as a luminescent material YAG:Ce.

WO 02/057198 describes the production of transparent ceramics such as YAG:Nd, which may in this case be doped with neodymium. Ceramics of this type are used as solid-state lasers.

DISCLOSURE OF THE INVENTION

It is an object of the present invention to specify a light source having an LED in accordance with the preamble of claim 1 which has a high light power over a longer operating phase in comparison with the prior art.

This object is achieved by means of the characterizing features of claim 1. Preferred embodiments are found in the subclaims. In order to achieve the object, a light source is specified, having at least one LED for emitting a primary radiation and at least one luminescence conversion body having at least one luminescent material for converting the primary radiation into a secondary radiation. The light source has a luminescence conversion body, which is a polycrystalline ceramic body sintered together from individual crystallites. The crystallites comprise a selected base material. Some of the crystallites, or else the entire ceramic body, are activated with a dopant, so that this activated base material acts as luminescent material. By way of example, the base material is YAG and the activated base material is YAG:Ce, that is to say YAG activated by means of doping with Ce.

It is a further object to specify a method for producing a luminescence conversion body of a light source in accordance with the preamble of claim 17. In order to achieve the object, a method for producing a luminescence conversion body of a light source having the characterizing method steps of claim 17 is also specified.

In particular, these steps comprise:
a) provision of a polycrystalline ceramic body made of a ceramic base material and b) doping of at least part of the ceramic body with a dopant, as a result of which said part of the ceramic body virtually forms the luminescent material. The LED and the luminescence conversion body are optically coupled to one another in order to convert the primary radiation into the secondary radiation. This means that the luminescence conversion body is positioned at an exit side for the primary radiation from the LED.

In this case, the ceramic body may act completely as luminescent material by being modified by a dopant. Preferably, however only part, in particular a region at the front face or rear face of the ceramic body, relative to the position of the LED, is formed by a ceramic base material which is activated with a dopant. In this case, the concentration of the dopant decreases from the surface into the interior of the ceramic body, in particular exponentially.

The ceramic body may contain a single luminescent material. However, it is also possible for a multiplicity of luminescent materials to be present in the ceramic body. In particular, one doping (for example Ce) may yield one color, and a second or further dopings (for example Eu, Nd, Tb or Er or Pr alone or in combination with one another or with Ce) may yield a second color. The first doping may be distributed at the front side and the second doping at the rear side or between zones in chessboard-like fashion at the front side. Any desired mixed color can be produced in this way. The different luminescent materials are excited by primary radiation from the same or else from different wavelength ranges of a wide primary spectrum. The excited luminescent materials in each case emit secondary radiation in mutually different wavelength ranges. The secondary radiations with different emission wavelengths form a mixed color of the light source, possibly together with an unconverted remainder of the primary radiation, which is in particular blue or green.

For a high light power, it is particularly advantageous if the ceramic body is translucent and/or transparent to the primary radiation and/or to the secondary radiation. For this purpose in one particular refinement, the ceramic body has a ceramic density of above 90%, and in particular at least 95% to 97%, in particular almost 100%. Above this ceramic density of 90%, the ceramic body is distinguished by sufficiently high translucency to the secondary radiation. This means that said radiation can pass through the ceramic body. For this purpose, the ceramic body preferably has a transmission of above 60% for the secondary radiation of a specific wavelength. A preferred embodiment is for the secondary radiation and/or the primary radiation to be scattered at scattering centers in the ceramic body and to pass through the ceramic body via in part even multiple scattering. Impurity crystallites, in particular, are used as scattering centers.

In one particular refinement, the ceramic body has crystallites with a grain size from the range of 1 μm to 100 μm inclusive. The grain size is an equivalent diameter of the crystallites of a microstructure of a ceramic. The grain size is preferably 10 μm to 50 μm. This grain size enables efficient luminescence conversion. Furthermore, the ceramic grains of the base material and/or the ceramic grains of the luminescent material may function as scattering centers by producing suitably dimensioned pores in accordance with the theoretical density chosen.

Examples of appropriate luminescent materials are base materials such as aluminates, garnets or silicates which are partly doped with a rare earth metal. In one particular refinement, the luminescent material is a cerium-doped yttrium aluminum garnet. Yttrium aluminum garnet is "activated" by means of the doping with cerium. Cerium functions as an activator. A yellow-emitting luminescent material results. In this case, the position of the emission maximum of the luminescent material depends on the cerium concentration.

The ceramic body may be doped with cerium or a different dopant (activator) over the entire volume.

However, it is also conceivable for the ceramic body to only partly have the doping. By way of example, only a region of the ceramic body near the surface is doped. One embodiment is for regions with and without doping to be present in said region near the surface. The ceramic body is for example a parallelepiped with a front side facing the LED and a rear side remote therefrom and also side areas.

The LED may have any desired semiconductor material for emission of the primary radiation. By way of example, the LED is a UW-LED with an emission from the range of 370 nm to 400 nm. In one particular refinement, the LED has a semiconductor material selected from the group of gallium indium nitride and/or gallium nitride. These semiconductor materials emit relatively short-wave (blue) primary radiation (for example 400 nm to 480 nm) when driven electrically. This primary radiation is suitable in particular for excitation of the abovementioned luminescent materials. A combination of such an LED with a ceramic body comprising cerium-doped yttrium aluminum garnet is particularly advantageously suitable. A white-emitting luminescence conversion LED is accessible through this combination.

In a further refinement, the ceramic body is assigned a multiplicity of LEDs. The ceramic body, for example a plate, is irradiated by a multiplicity of LEDS. An areal light source with a homogeneous color impression over a relatively large area is thereby obtained in particular when using a ceramic body with scattering centers, in particular with pores corresponding to a theoretical density of 93 to 98%.

The ceramic body may be spaced apart from the LED, that is to say be arranged "remote from the LED". The ceramic body and the LED are then situated at a relatively large distance from one another. The distance is a few millimeters, for example. However, the ceramic body may, in particular, also be arranged "near the LED". For this purpose, in accordance with one particular refinement, the base material of the ceramic body is at the same time a carrier body (substrate) of the LED. This means that the LED is arranged indirectly or directly on the ceramic body. One example is a ceramic body which is configured in T-shaped fashion and whose two arms of the T form the substrate, while the stub of the T forms the luminescence conversion body. A further substrate for the arrangement of the LED is not necessary.

In one particular refinement, a connecting layer for fixedly connecting the LED and the ceramic body is present between the LED and the ceramic body. The connecting layer has an adhesive, in particular. The adhesive is used to produce a material joint between the LED and the ceramic body. The adhesive is preferably made of a material which is largely photostable. This means that the adhesive can be irradiated with ultraviolet light without a photoinduced chemical reaction taking place in a lasting manner. This reaction could, in a similar manner to the epoxy resin, lead to reaction products which could impair the efficiency of the transfer of the primary radiation to the luminescence conversion body. It is to be expected, however, that in the case of a connecting layer of a few μm, the transmission of the adhesive for the wavelengths of the primary radiation changes only little due to the presence of the reaction products.

In a further refinement, the ceramic body has at least one optical element for influencing a beam path of the primary radiation and/or a beam path of the secondary radiation. The optical element is preferably arranged at at least one surface section of the ceramic body. By way of example, the optical element is a roughened and/or polished surface section.

In particular, the optical element is advantageously a lens. The lens may be of concave or convex form in this case. In this way, the surface section can have a focusing or defocusing effect on the primary and secondary radiation.

In a further refinement, the optical element is at least one scattering center which scatters the primary radiation and/or the secondary radiation. The scattering center or centers is or are formed for example by the base material of the ceramic body. By way of example, the optical element is a roughened surface of the ceramic body.

In particular, the scattering center has a substance selected from the group of aluminum oxide, titanium oxide, yttrium aluminum garnet and/or yttrium oxide. It is preferred in this case for said substances to be arranged at a surface section of the ceramic body. The substances mentioned are advantageously contained as scattering centers in the volume of the ceramic body, for example as a layer.

In one particular refinement of the method for producing the luminescence conversion body, the ceramic body and a solution of the dopant are united for doping purposes. By way of example, an (alcoholic or aqueous) solution containing cerium (III) ions is applied on a ceramic body made of yttrium aluminum garnet. The uniting of the ceramic body and the dopant is followed in particular by a thermal treatment. This results in the doping. By way of example, a heat treatment at a temperature of 1500° C. is carried out. Cerium is incorporated into the yttrium aluminum garnet by diffusion.

In particular, the uniting is carried out by means of a coating method selected from the group of spin-on methods, dip methods and/or drop methods. The result of this chemical coating method (chemical solution depositon, CSD) is a thin layer of the solution of the dopant on a surface section of the ceramic body.

In order to obtain larger layer thicknesses with the doping, the uniting of the ceramic body made of the ceramic base material and the solution of the dopant and/or the thermal treatment are preferably carried out repeatedly.

With this method, a patterned luminescence conversion body may be obtained, in particular, by means of methods known from photolithography. Activated and nonactivated surface sections of the luminescence conversion body lie next to one another.

In particular, a ceramic body with a ceramic base material selected from the group of aluminum oxide, yttrium aluminum garnet and/or yttrium oxide is used for producing the luminescence conversion body.

As an alternative to the method presented, already doped ceramic starting material is sintered to form the luminescence conversion body.

To summarize, the invention affords the following essential advantages: the light source having the LED and the ceramic, translucent luminescence conversion body is distinguished by a high light power. The luminescence conversion body is thermally and photochemically stable. The high light power is therefore maintained even in the event of relatively long operation of the light source. The luminescence conversion body may have optical elements such as a lens or scattering centers.

BRIEF DESCRIPTION OF THE FIGURES

The invention is explained in more detail below on the basis of an example and with reference to the associated figures. The figures are diagrammatic and do not represent illustrations that are true to scale.

PREFERRED EXEMPLARY EMBODIMENTS

Figure 1:
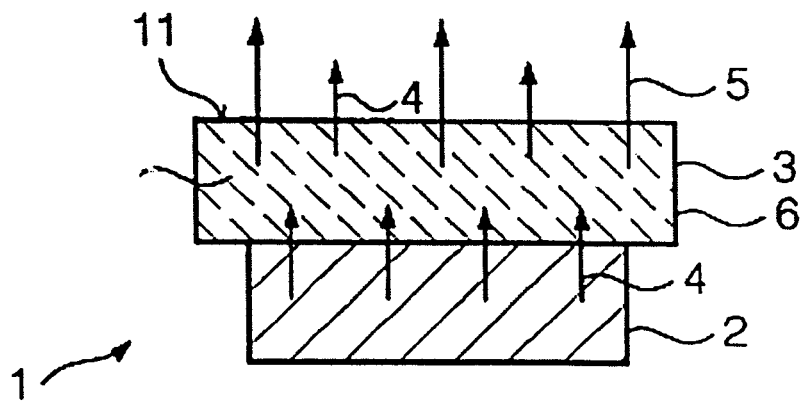
FIGS. 1 to 3 show different arrangements of the LED and of the luminescence conversion body to form a light source in cross section.

The light source 1 in FIG. 1 is a luminescence conversion LED that radiates white light. It comprises an LED 2 and a luminescence conversion body 3. The LED 2 has GaInN as semiconductor material. The LED 2 emits blue light with an intensity maximum at about 450 nm as primary radiation 4.

The luminescence conversion body 3 is a polycrystalline ceramic body having a ceramic density of about 95% of the theoretical density. The ceramic body 3 comprises ceramic particles, that is to say crystallites, having an average grain size of 10 µm to 20 µm (understood as equivalent diameter). The base material of the ceramic body 3 is an yttrium aluminum garnet. The base material is homogeneously doped with Ce for activation purposes. The Ce-doped, still ceramic base material functions as luminescent material which converts the primary radiation 4 of the LED 2 into the secondary radiation 5. The secondary radiation 5 emitted by the luminescent material has an intensity maximum—dependent on the Ce concentration—in the yellow spectral range. The luminescence conversion body 3 has a transmission of about 80% for the secondary radiation 5.

The luminescence conversion body is translucent both to the primary radiation and to the secondary radiation. Only part of the primary radiation is converted into secondary radiation with the aid of the luminescent material. Primary radiation and secondary radiation pass through the luminescence conversion body 3 and appear as white light to the observer.

The luminescence conversion body 3 functions as carrier body 6 of the LED 2. The LED 2 and the luminescence conversion body 3 may be arranged directly on one another (FIG. 1).

Figure 2:
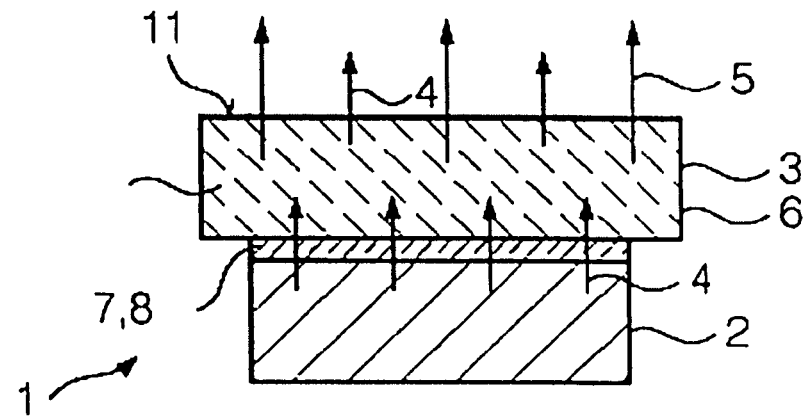

As an alternative to this, a connecting layer 7 is arranged between LED 2 and luminescence conversion body 3. The connecting layer 7 has an adhesive 8, see FIG. 2. The LED 2 and the luminescence conversion body 3 are adhesively bonded to one another. In order to produce this arrangement, by way of example, the LED 2 is deposited epitaxially on an auxiliary substrate. Afterward, the auxiliary substrate is removed and the LED 2 and the luminescence conversion body 3 are connected with the aid of the adhesive 8.

Figure 3:
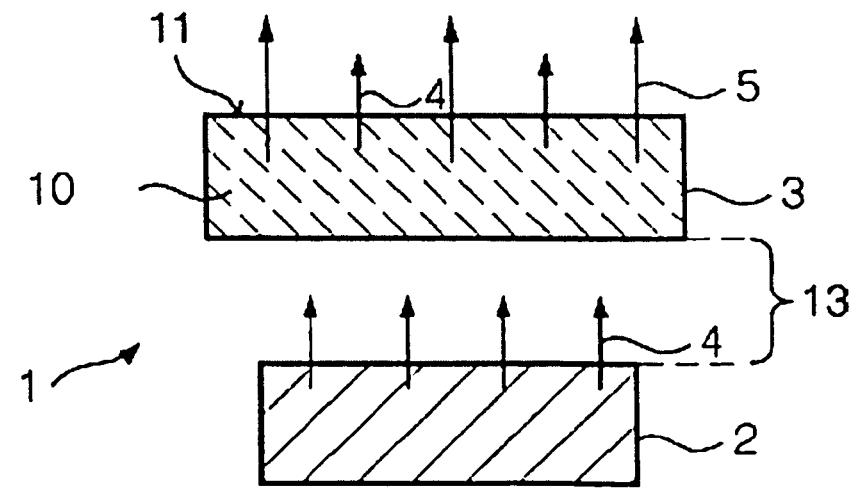

In a further embodiment, the luminescence conversion body 3 does not function as carrier body 6 of the LED 2. The LED 2 and the luminescence conversion body 3 are arranged at a distance 13 of a few millimeters from one another (FIG. 3).

The luminescence conversion body 3 has in particular at least one optical element 10 for influencing a beam path of the primary radiation 4 and a beam path of the secondary radiation 5. Said optical element 10 in this case comprises a multiplicity of homogeneously distributed scattering centers which are formed by the base material itself as pores in the volume of the luminescence conversion body 3, see FIG. 3.

Figure 4:
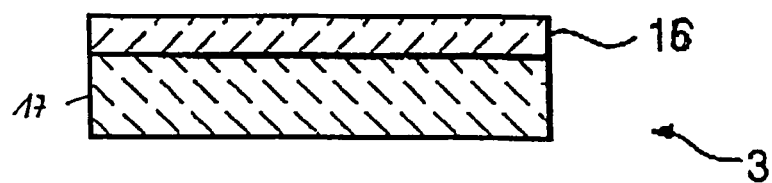
FIGS. 4 and 5 show luminescence conversion bodies in cross section.

In FIG. 4 there is a luminescence conversion body 3 which comprises a carrier 17, which only contains base crystallites (for example YAG), and whose rear face (relative to the LED) has a layer 16 having a depth of a few mm which is activated by doping with Ce, so that YAG:Ce is present there as effective luminescent material. In this case, the Ce concentration generally decreases greatly toward the interior until it is no longer effective.

Figure 5:
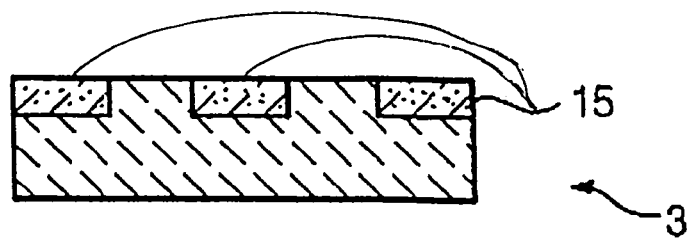

What are also appropriate as scattering centers are impurity crystallites in the composite of the crystallites of the base material (base crystallites), for example $Al_2O_3$ in YAG:Ce or YAG. In particular, yttrium oxide in YAG:Ce or YAG is preferred. By way of example, one or more zones 15 may have a relatively high concentration of impurity crystallites, symbolized as dots in FIG. 5.

Figure 6:
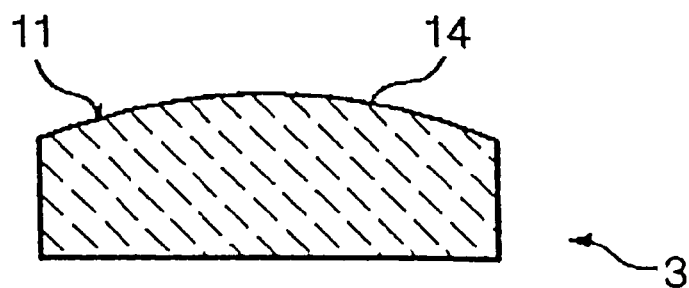
FIGS. 6 and 7 show luminescence conversion bodies with differently configured surface sections.
Figure 7:
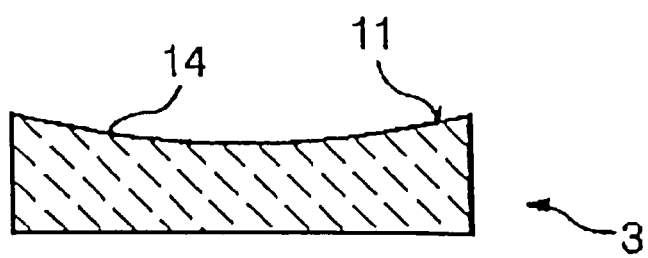
Figure 8:
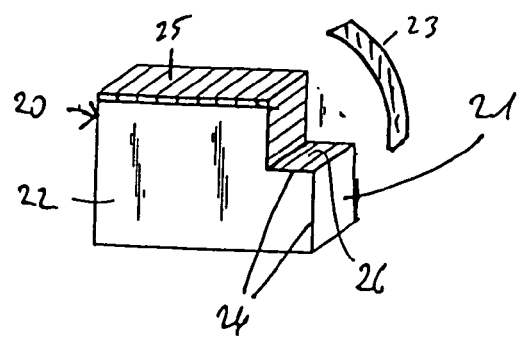
FIG. 8 shows an integral embodiment of LED and luminescence conversion body.

In accordance with further embodiments, the luminescence conversion body 3 has a lens 14. For this purpose, the surface section 11 of the luminescence conversion body 3 is of convex form (FIG. 6) or concave form (FIG. 7).

In a further embodiment, the LED and the luminescence conversion body are an integral body 20 which, by way of example, is configured in T-shaped fashion or L-shaped fashion with arms 21 and a stub 22. The arms serve, as known per se (for example GB 2 325 080) as a ceramic substrate, and a region 26 of the arms 21 is coated epitaxially, or an LED is placed thereon, so that the arms serve as radiation generator of the LED. This radiation is guided into the stub, either externally by means of reflectors 23 or internally by means of total reflection at the surfaces 24, with the result that a suitably doped layer 25 present in the stub 22 effects the luminescence conversion.

In order to produce the luminescence conversion body, a ceramic body made of yttrium aluminum garnet is provided, said ceramic body being doped with cerium. For this purpose, the ceramic body is coated by dip-coating (dip method) five times with a solution of 0.5 M cerium (III) nitrate and 1.0 M ethylene glycol in ethanol. Each coating is followed by a short thermal treatment (about five minutes at 400° C.). Finally, heat treatment is carried out at 1500° C. for two hours.

Cerium diffuses into the yttrium aluminum garnet in the process. A layer with the luminescent material is formed in the ceramic body.

In a further embodiment, the layer with the luminescent material is patterned using a photolithography method.

A method for producing a luminescence conversion body of a light source exhibits the following method steps, in particular:

provision of a polycrystalline ceramic body made of a ceramic base material and doping of the ceramic body with a dopant, so that the ceramic body acts as luminescent material, by a procedure in which the dopant or a corresponding chemical precursor is applied to the ceramic body, in particular only to part of the ceramic body, and subsequently is diffused into the ceramic body by thermal treatment. In this case, the dopant penetrates into the ceramic body to a different depth depending on applied quantity, selected temperature and duration of the treatment. The dopant is advantageously applied only on one side of the ceramic body, which is often a parallelepiped. It can also be applied on two opposite sides.

As an alternative, the ceramic body may also be introduced into a salt bath of the dopant, for example the doping Ce as cerium chloride bath, and be exposed there to diffusion from all sides over a relatively long period of time, which may be 10 to 70 hours.

Pores prove to be particularly preferred scattering centers, said pores having a different effect depending on size and number. One measure of the pore quantity and size is, in particular, the density. The lower the density, the greater the number of pores acting as scattering centers. Below 90% of the theoretical density, the scattering behavior is too intense; good results can be achieved with 93 to 97% of the theoretical density.

The invention claimed is:

1. A conversion LED, comprising:
   one LED for emitting a primary radiation, the LED comprising a semiconductor material selected from the group consisting of GaInN, GaN, and a combination thereof; and
   one luminescence conversion body for converting the primary radiation into a secondary radiation,
   wherein the luminescence conversion body is a polycrystalline ceramic body sintered together from individual base crystallites that are formed by a base material that is doped by a dopant such that the polycrystalline ceramic body acts partly or completely as luminescent material by virtue of at least part of the base material being activated by said dopant,
   wherein the ceramic body has a ceramic density of above 90% so that the ceramic body is translucent to both the primary radiation and the secondary radiation,
   wherein the ceramic body comprises at least one optical element for influencing a beam path of the primary radiation and a beam path of the secondary radiation, said optical element being formed from a plurality of scattering centers, the scattering centers comprising impurity crystallites selected from the group consisting of aluminum oxide, titanium oxide, yttrium aluminum garnet (YAG), yttrium oxide, and combinations thereof within the ceramic body, and
   wherein one or more zone of the ceramic body have a high concentration of the impurity crystallites.

2. The conversion LED as claimed in claim 1, wherein the scattering centers are disposed at one surface section of the ceramic body.

3. The conversion LED as claimed in claim 1, wherein the impurity crystallites comprise yttrium oxide and the base crystallites comprise YAG.

4. The conversion LED as claimed in claim 1, wherein the luminescent material comprises a cerium-doped yttrium aluminum garnet.

* * * * *